(12) United States Patent
Park

(10) Patent No.: US 7,206,228 B2
(45) Date of Patent: Apr. 17, 2007

(54) BLOCK SWITCH IN FLASH MEMORY DEVICE

(75) Inventor: Jin Su Park, Daegu-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 177 days.

(21) Appl. No.: 11/010,156

(22) Filed: Dec. 10, 2004

(65) Prior Publication Data

US 2006/0083062 A1  Apr. 20, 2006

(30) Foreign Application Priority Data

Oct. 5, 2004   (KR) .................. 10-2004-0078957

(51) Int. Cl.
*G11C 11/34* (2006.01)
(52) U.S. Cl. .................. 365/185.17; 365/185.23; 365/185.18; 365/185.13
(58) Field of Classification Search ................ None
See application file for complete search history.

(56) References Cited

U.S. PATENT DOCUMENTS 6,278,315 B1 * 8/2001 Kim ...................... 327/536

6,337,807 B2 * 1/2002 Futatsuyama et al. . 365/185.17
6,611,460 B2 * 8/2003 Lee et al. .............. 365/185.18

\* cited by examiner

*Primary Examiner*—Amir Zarabian
*Assistant Examiner*—Kretelia Graham
(74) *Attorney, Agent, or Firm*—Marshall, Gerstein & Borun LLP

(57) ABSTRACT

Disclosed herein is a block switch of a flash memory device in which a voltage higher than a predetermined operating voltage is generated to drive path transistors in order to stably apply the predetermined operating voltage to a selected cell block of the flash memory device. The block switch generates a high voltage clock signal of a high voltage level according to a control signal and a clock signal, and raises the voltage level of an output terminal to a predetermined level according to the high voltage clock signal. Accordingly, a high voltage can be outputted even at a low power supply voltage. There is no need for a decoder for high voltage as in a precharge and self-boosting mode. A voltage can be directly applied to word lines without a precharge operation. It is thus possible to reduce an operating time.

7 Claims, 4 Drawing Sheets

BLOCK SWITCH IN FLASH MEMORY DEVICE

This application relies for priority upon Korean Patent Application No. 2004-0078957 filed Oct. 5, 2004, the contents of which are herein incorporated by reference in their entirety.

BACKGROUND

1. Field of the Invention

The present patent relates to a block switch of a flash memory device, and more specifically, to a block switch of a flash memory device in which a high voltage can be output stably even at a low power supply voltage and the operating time can be reduced while not increasing the chip area.

2. Discussion of Related Art

FIG. 1 is a circuit diagram showing the configuration of a conventional NAND-type flash memory device. The NAND-type flash memory device includes a plurality of cell blocks 100 and row decoders 200.

One of the cell blocks 100 includes a plurality of cell strings 110 to which a plurality of cells is serially connected, the m number of bit lines BL, the n number of word lines WL, drain select transistors 120 connected between the cell strings 110 and the bit lines BL, and source select transistors 130 connected between the cell strings 110 and a common source line. Meanwhile, a plurality of memory cells that share on word line constitute one page 140. All the cells share a P well. Furthermore, the drain select transistors 120 share a drain select line DSL and the source select transistors 130 share a source select line SSL.

One of the row decoders 200 includes a predecoder 210, a block select circuit 220 and a plurality of path transistors 230. The predecoder 210 decides a bias of a plurality of global word lines GWL0 to GWLn-1 in order to perform a given operation, and supplies operation of high voltage through the plurality of the global word lines GWL0 to GWLn-1. For example, the predecoder 210 supplies a select voltage through one of the global word lines GWL0 to GWLn-1 and a non-select voltage through another of the global word lines GWL0 to GWLn-1 in order to perform the given operation.

The block select circuit 220 includes a plurality of block switches 240 corresponding to the number of the cell blocks 100. The block switches 240 of a selected block operate to output a block select signal Bsel. The block select signal Bsel turns on the path transistors 230 of a selected cell block and turns off the path transistors 230 of a non-selected block. In this time, the block switches 240 generate the block select signals Bsel, which is higher than a voltage received through the global word lines GWL0 to GWLn-1, so as to transfer a voltage received from the predecoder 210 through the global word lines GWL0 to GWLn-1 stably. Accordingly, the selected cell block is supplied with the select voltage (Vsel) or the non-select voltage (Vunsel) through the plurality of the global word lines GWL0 to GWLn-1, the plurality of the path transistors 230 and the word lines WL0 to WLn-1. Meanwhile, the non-selected cell block is not supplied with the voltage through the plurality of the global word lines GWL0 to GWLn-1 because the path transistors 230 are turned off. Thus, the word lines WL0 to WLn-1 stay floated.

Meanwhile, the path transistors 230 serve as a switch for applying a predetermined voltage to the word lines WL0-to WLn-1 of the cell block 100 through the global word lines GWL0 to GWLn-1. The path transistors 230 include a high voltage transistor for drain select 250, a high voltage transistor for source select 270 and a high voltage transistor for cell select 260.

In the above construction, the block switches for driving the path transistors generate a voltage higher than the high voltage received through the global word lines, in order to stably transfer the high voltage to cells of a selected block without a threshold voltage drop.

For this, an existing block switch generates a high voltage, like a charge pump using a clock. In a low power supply voltage of below 1.8V, however, the block switch has a problem that it cannot generate a high voltage of over 18V, which is a program bias.

In order to overcome this problem, there was proposed a block switch using a precharge and self-boosting mode as shown in FIG. 2. FIG. 2 is a circuit diagram showing the configuration of a conventional block switch. FIG. 3 is a diagram showing an operational waveform of the conventional block switch. A conventional method of driving the block switch of the precharge and self-boosting mode will be described with reference to FIGS. 2 and 3.

If a select signal SELb is enabled to be a Low level and a precharge signal PREb is enabled to be a Low level, first and second control signals GA and GB rise up to a pumping voltage (Vpp). In this time, a NAND gate 301, which receive the select signal SELb of the Low level and the precharge signal PREb of the Low level as an input, outputs a signal of a High level. The output signal of the High level of the NAND gate 301 is inverted to a Low level through an inverter 302, thus turning off an NMOS transistor 306. Meanwhile, NMOS transistors 303 and 304 are respectively turned on by the first and second control signals GA and GB of the pumping voltage (Vpp) level. Accordingly, the output terminal Bsel is precharged with a first voltage (Vpp−Vt) in which the threshold voltage (Vt) of the NMOS transistor 303 is subtracted from the pumping voltage (Vpp). If the precharge operation is completed and the precharge signal PREb becomes a High level, the first and second control signals GA and GB become a Low level to turn off the NMOS transistors 303 and 304, so that the output terminal Bsel[k] is floated. In this time, if a predetermined voltage is applied to the drain terminal of the path transistor through the global word lines GWL, the output terminal Bsel of the block switch is self-boosted by overlap capacitance between the drain and gate-terminals of the path transistor 307. Accordingly, the output terminal Bsel of the block switch has a voltage ΔV, which is higher than the first voltage (Vpp−Vt).

The greater the number of the path transistors 307 and the higher the voltage applied through the global word lines GWL, the more the self-boosting operation is easily generated. It is required that the boosting level, i.e., ΔV is 2Vt or more. The output terminal Bsel is increased from the first voltage (Vpp−Vt) to the second voltage (Vpp+Vt) by the self-boosting operation.

The block switch of the precharge and self-boosting mode can operate regardless of the power supply voltage. However, the operating speed of the block switch becomes slow because the precharge operation is needed before the voltage is applied to the word lines. Furthermore, in order to selectively precharge block word lines of a selected block, the first and second control signals GA and GB must be selectively applied. Thus, a decoder for applying the first and second control signals GA and GB is additionally required. In addition, since the first and second control signals GA and GB must be applied as the pumping voltage (Vpp) level, a decoder for high voltage is necessary. However, this decoder for high voltage is constructed using a switch for high voltage. Accordingly, the chip area is increased because the area of the switch is significantly great.

SUMMARY OF THE INVENTION

Accordingly, the present invention addresses the above problems, and provides a block switch of a flash memory device in which a high voltage can be outputted stably even at a low power supply voltage.

The present invention also provides a block switch of a flash memory device in which a high voltage can be output stably while not increasing the chip area because additional components are not needed.

To accomplish this, according to an aspect of the present invention, there is provided a block switch of a flash memory device for generating a voltage higher than a predetermined operating voltage in order to stably apply the predetermined operating voltage to a selected cell block of the flash memory device, wherein the block switch generates a high voltage clock signal of a high voltage level according to a select signal and a clock signal, and raises the voltage level of an output terminal to a predetermined level according to the high voltage clock signal.

The select signal and the clock signal maintain a power supply voltage level. The block switch further includes a high voltage clock generating means for outputting the high voltage clock signal higher than a power supply voltage according to the select signal and the clock signal. The block switch further includes a capacitor, which is charged according to the high voltage clock signal, so that the potential of the output terminal is increased.

According to another aspect of the present invention, there is provided a block switch of a flash memory device, comprising: first switching means that transfers a select signal of a power supply voltage level to an output terminal so that the output terminal maintains a first potential, second switching means that supplies a pumping voltage to a node according to the potential of the output terminal so that the node maintains a second potential, high voltage clock generating means for outputting a high voltage clock signal higher than the power supply voltage according to the select signal and a clock signal, a capacitor which is charged according to the high voltage clock signal so that the node maintains a third potential, and third switching means that supplies the potential of the node to the output terminal according to the potential of the node so that the output terminal maintains a fourth potential, wherein the capacitor is repeatedly charged with the high voltage according to the clock signal so that the potential of the output terminal rises to a predetermined potential.

The high Voltage clock generating means includes a NAND gate for inverting the clock signal according to the select signal, and a level shifter for outputting the high voltage clock signal higher than the power supply voltage according to the output signal of the NAND gate.

According to further aspect of the present patent, there is provided a block switch of a flash memory device, wherein the flash memory cell includes: a plurality of cell blocks including a plurality of cell strings to which a plurality of cells is serially connected, wherein one bit line is allocated to each of the cell strings, and a plurality of the cells that share one word line among the plurality of the cells constitutes a page, a plurality of block switches that outputs a predetermined voltage for selecting the cell block, a predecoder that applies a high voltage for a predetermined operation to the cell block through a plurality of global word lines, and path transistors that apply a predetermined voltage through the global word lines to the word line of the cell block according to the output signal of the block switch, wherein the block switch generates a high voltage clock signal higher than a power supply voltage according to a select signal and a clock signal of the power supply voltage level and raises the level of an output terminal to a predetermined level according to the high voltage clock signal.

DETAILED DESCRIPTION OF PREFERRED VARIOUS EMBODIMENTS

Various embodiments will be described below with reference to the accompanying drawings.

Figure 1:
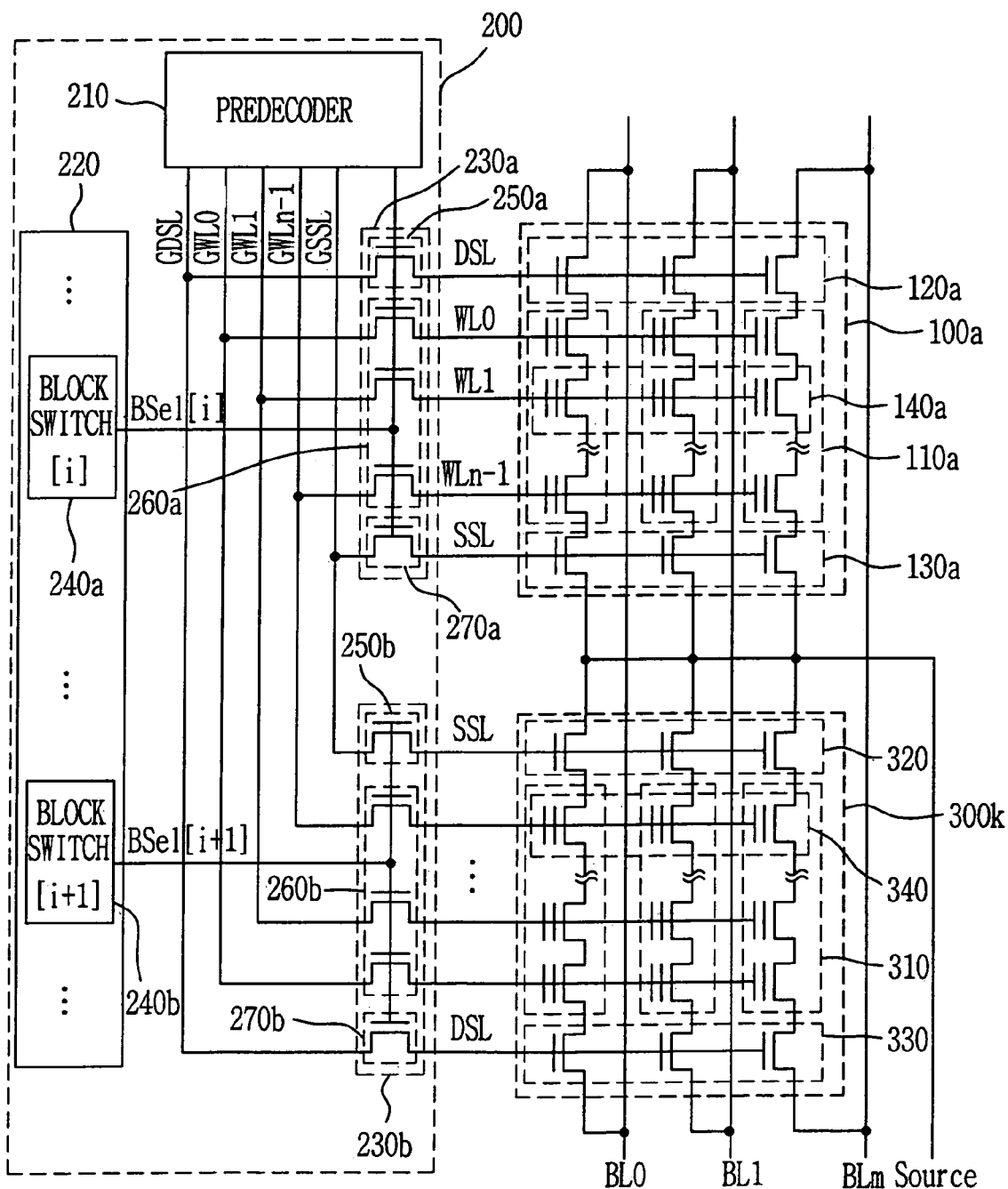
FIG. 1 is a circuit diagram showing the configuration of a conventional NAND-type flash memory device.
Figure 2:
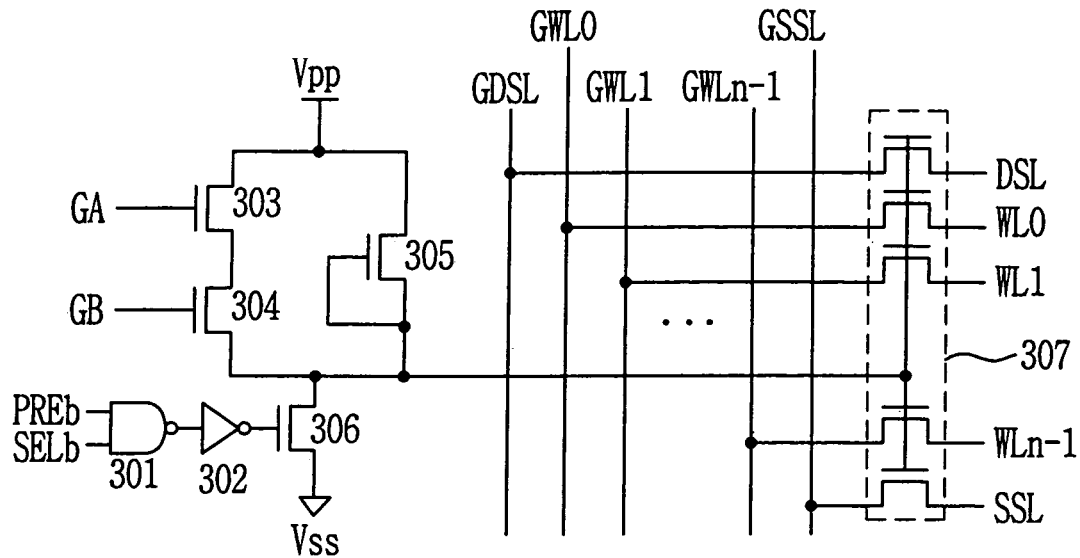
FIG. 2 is a circuit diagram showing the configuration of a conventional block switch.
Figure 3:
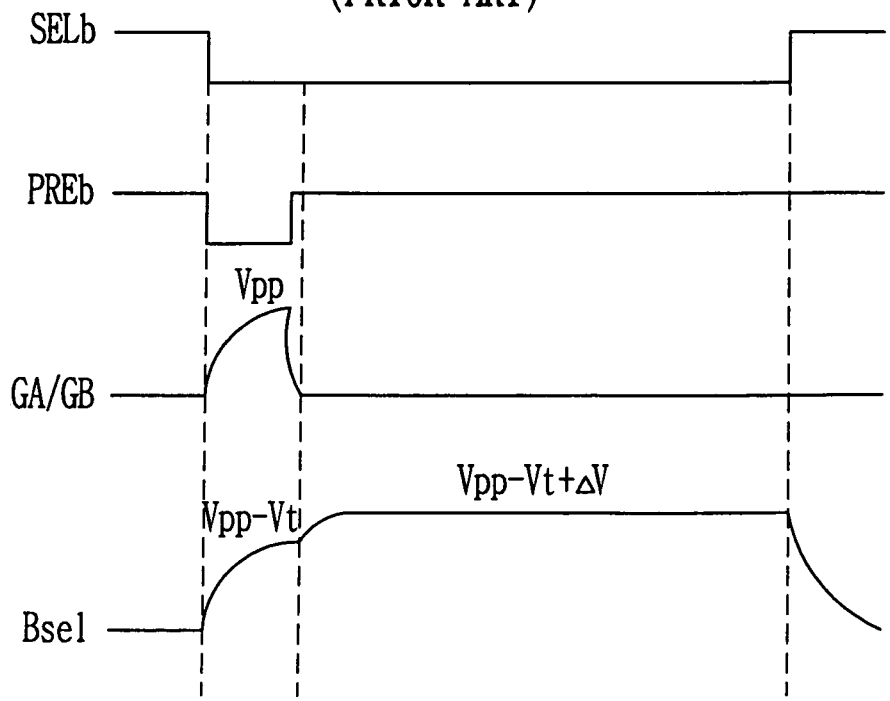
FIG. 3 is a diagram showing an operational waveform of the conventional block switch.
Figure 4:
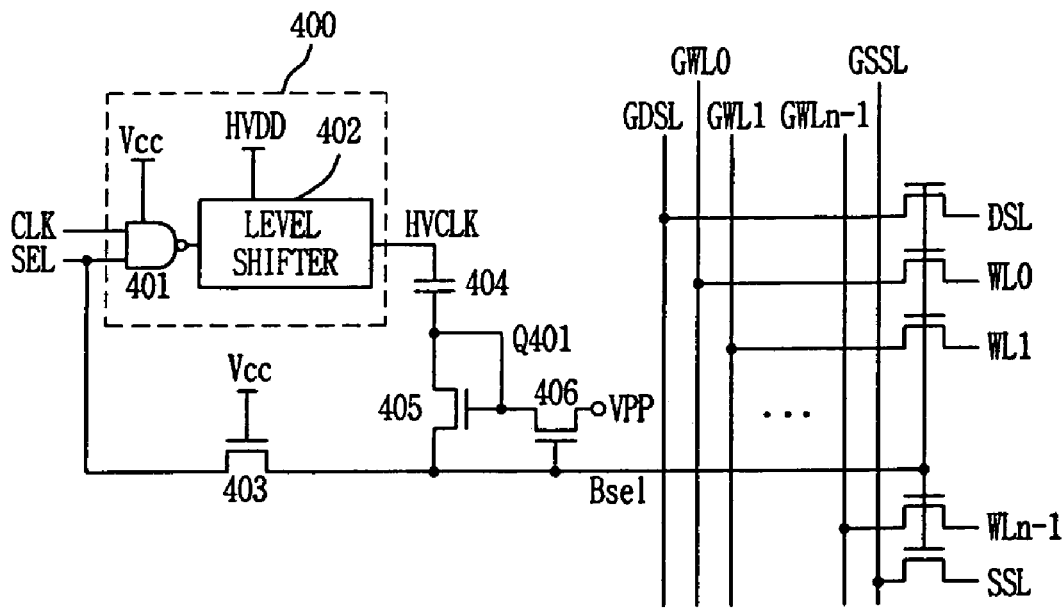
FIG. 4 is a circuit diagram showing the configuration of a block switch.

FIG. 4 is an exemplary circuit diagram showing the configuration of a block switch. Referring to FIG. 4, an NMOS transistor 403 is driven according to a power supply voltage (Vcc) to transfer a select signal SEL of the power supply voltage (Vcc) level to an output terminal Bsel. An NMOS transistor 406 is driven according to the potential of the select signal SEL received through the NMOS transistor 403 and transfers a pumping voltage (Vpp) to a node Q401. A high voltage clock generator 400 includes a NAND gate 401 and a level shifter 402. The NAND gate 401 inverts a clock signal CLK according to the select signal Bsel. The level shifter 402 outputs a high voltage clock HVCLK of a high voltage level, which is higher than the power supply voltage (Vcc), according to the output signal of the NAND gate 401. That is, the level shifter 402 shifts the clock signal CLK of the power supply voltage (Vcc) level to the high voltage clock signal HVCLK of the high voltage (HVDD) level. A capacitor 404 is charged according to the high voltage clock signal HVCLK outputted from the high voltage clock generator 400. An NMOS transistor 405 is driven according to the potential of the node Q401 and transfers the potential of the node Q401 to an output terminal SEL. Meanwhile, the high voltage (HVDD) applied to the level shifter 402 is generated through a pumping circuit, which constitutes a NAND-type flash memory device. Therefore, an additional circuit is not needed. Furthermore, if the high voltage (HVDD) is higher than the threshold voltage of the NMOS transistors 405 and 406, a margin for pumping can be secured regardless of the power supply voltage (Vcc).

Figure 5:
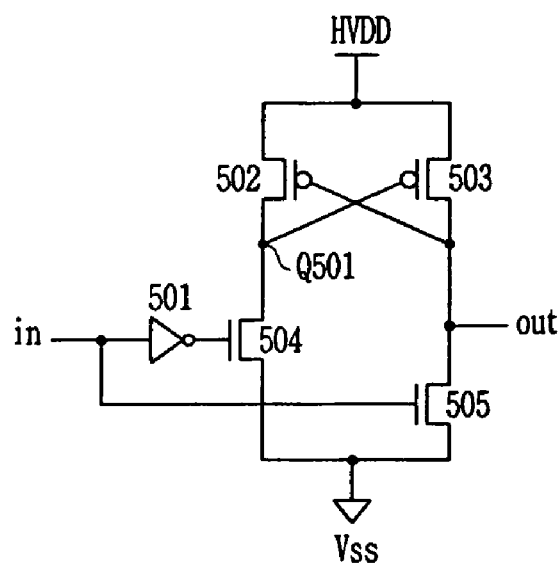
FIG. 5 is a circuit diagram showing the configuration of a level shifter which is applied to the block switch.

FIG. 5 is a circuit diagram showing the configuration of the level shifter, which is applied to the block switch according to the present invention. A method of driving the level shifter will now be described.

An input signal in drives an NMOS transistor 505 connected between an output terminal out and a ground terminal (Vss). The input signal in is inverted by an inverter 501 and drives an NMOS transistor 504 connected between a node Q501 and the ground terminal (Vss). Furthermore, a PMOS transistor 502 is driven by the potential of the output terminal out, and a PMOS transistor 503 is driven by the potential of the node Q501.

Therefore, if the input signal in is applied as a High level, it turns on the NMOS transistor 505 and is inverted to a Low level by the inverter 501, thus turning off the NMOS transistor 504. Thereby, the output terminal out becomes a Low level, and the PMOS transistor 502 is turned on by the potential of the output terminal out of the Low level. Thus, the node Q501 becomes a high voltage (HVDD) level. The PMOS transistor 503 is turned off by the potential of the high voltage (HVDD) level of the node Q501 and the output terminal out becomes a Low level.

Meanwhile, if the input signal in is applied as a Low level, it turns off the NMOS transistor 505 and is inverted to a High level by the inverter 501, thus turning on the NMOS transistor 504. Thereby, the node Q501 becomes a Low level, and the PMOS transistor 503 is turned on by the potential of the Low level of the node Q501. Thus, the output terminal out becomes the high voltage (HVDD) level. As the output terminal out maintains the high voltage (HVDD) level, the PMOS transistor 502 is turned off and the node Q501 becomes a Low level.

That is, in the level shifter applied to the block switch of FIG. 5, if the input signal in becomes a Low level, the output terminal out becomes a high voltage (HVDD) level. If the input signal in becomes a High level, the output terminal out becomes a Low level.

Figure 6:
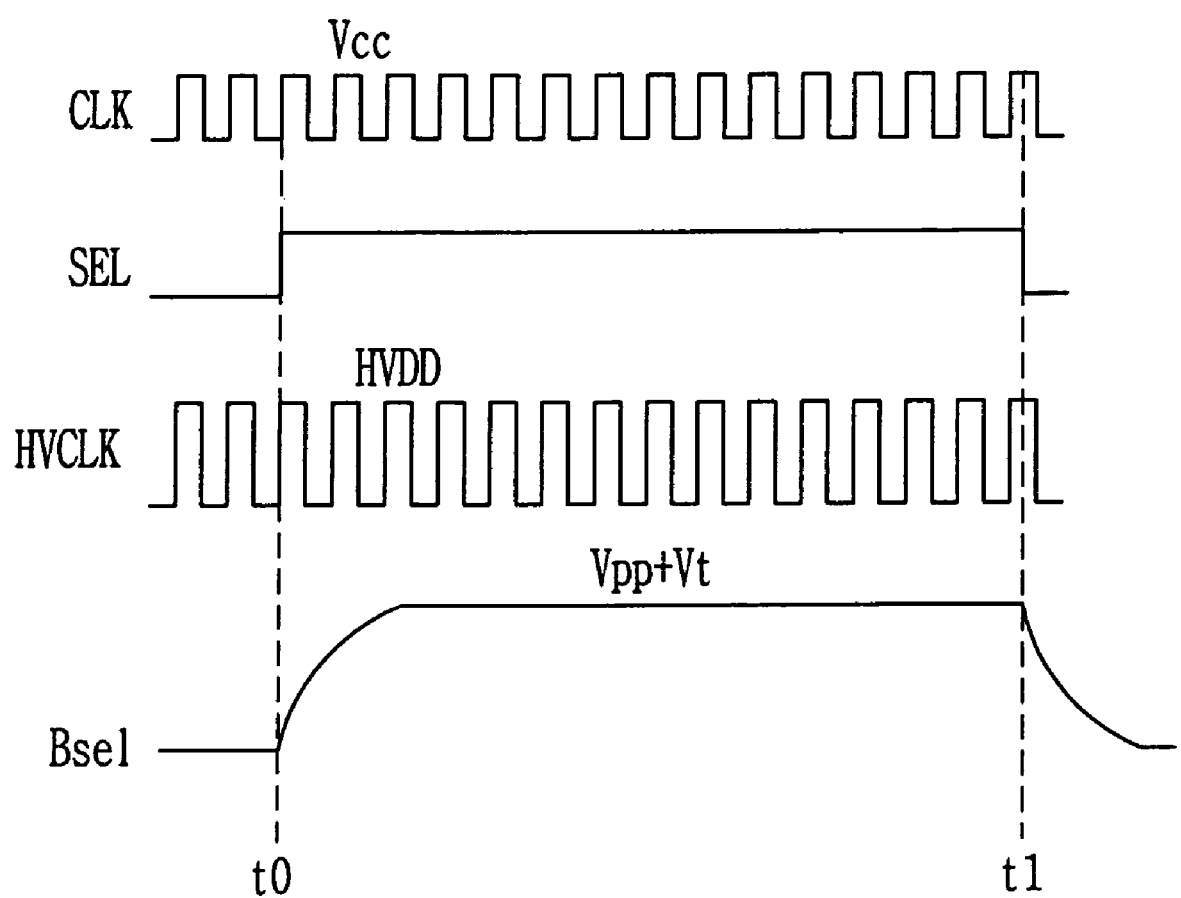
FIG. 6 is a diagram showing an operational waveform of the block switch.

A method of driving the block switch constructed above according to the present patent will now be described with reference to the operational waveform of FIG. 6.

If the select signal SEL is applied as a High level of the power supply voltage (Vcc) level, it is transferred to the output terminal Bsel through the NMOS transistor 403. Accordingly, the output terminal Bsel maintains a first voltage (Vcc−Vt1) in which a threshold voltage (Vt1) of the NMOS transistor 403 is subtracted from the potential of the select signal SEL[k] of the power supply voltage (Vcc) level. The NMOS transistor 406 is turned on by the potential of the output terminal Bsel that maintains the first voltage (Vcc−Vt1). The node Q401 maintains a second voltage (Vcc−Vt1−Vt2) in which the threshold voltage (Vt2) of the NMOS transistor 406 is subtracted from the potential of the output terminal Bsel.

If the select signal SEL is input as a High level and the clock signal CLK is input as a High level, the NAND gate 401 outputs a signal of a Low level. The output signal of the NAND gate 401, which is output as the Low level, is input to the level shifter 402. The level shifter 402 outputs a signal of the high voltage clock signal HVCLK. The capacitor 404 is charged according to the high voltage clock signal HVCLK, and the voltage of the node Q401 rises to a third voltage (Vcc−Vt1−Vt2+HVDD) in which the high voltage (HVDD) level is added to the second voltage (Vcc−Vt1−Vt2). The potential of the node Q401, which rises to the third voltage (Vcc−Vt1−Vt2+HVDD) is transferred to the output terminal Bsel through the NMOS transistor 405. Accordingly, the output terminal Bsel becomes the potential of a fourth voltage (Vcc−Vt1−Vt2+HVDD−Vt3) in which the threshold voltage (Vt3) of the NMOS transistor 405 is subtracted from the third voltage (Vcc−Vt1−Vt2+HVDD).

That is, the potential of the output terminal Bsel rises as much as HVDD−Vt2−Vt3 while passing through the NMOS transistor 405 and 406 for one clock cycle. If this is repeated, the output terminal Bsel rises to the voltage (Vpp+Vt).

As described above, a high voltage can be output even at a low power supply voltage. There is no need for a decoder for high voltage as in a precharge and self-boosting mode. A voltage can be directly applied to word lines without a precharge operation. It is thus possible to reduce an operating time.

Although the foregoing description has been made with reference to the various embodiments, it is to be understood that changes and modifications of the present invention may be made by the ordinary skilled in the art without departing from the spirit and scope of the present invention and appended claims.

What is claimed is:

1. A block switch of a flash memory device, comprising:
   first switching means to transfer a select signal of a power supply voltage level to an output terminal so that the output terminal maintains a first potential;
   second switching means to apply a pumping voltage to a node according to the potential of the output terminal so that the node maintains a second potential;
   high voltage clock generating means to output a high voltage clock signal higher than the power supply voltage according to the select signal and a clock signal;
   a capacitor which is charged according to the high voltage clock signal so that the node maintains a third potential; and
   third switching means that supplies the potential of the node to the output terminal according to the potential of the node so that the output terminal maintains a fourth potential,
   wherein the capacitor is repeatedly charged with the high voltage according to the clock signal so that the potential of the output terminal rises to a predetermined potential.

2. The block switch as claimed in claim 1, wherein the high voltage clock generating means comprises:
   a NAND gate to invert the clock signal according to the select signal; and
   a level shifter to output the high voltage clock signal higher than the power supply voltage according to the output signal of the NAND gate.

3. A block switch of a flash memory device, wherein the flash memory device comprises:
   a plurality of cell blocks including a plurality of cell strings to which a plurality of cells is serially connected, wherein one bit line is allocated to each of the cell strings, and a plurality of the cells that share one word line among the plurality of the cells comprises a page;
   a plurality of block switches that output a predetermined voltage to select the cell block;
   a predecoder that applies operation voltages of a high voltage for a predetermined operation to the cell block through a plurality of global word lines; and
   path transistors to apply a predetermined voltage through the global word lines to the word line of the cell block according to an output signal of the block switch,
   wherein the block switch is adapted to generate a high voltage clock signal higher than a power supply voltage according to a select signal and a clock signal of the power supply voltage level and raise the level of an output terminal to a predetermined level according to the high voltage clock signal, Wherein the block switch comprises: first switching means for transferring the select signal of the power supply voltage level to the output terminal so that the output terminal maintains a first potential; second switching means for applying a pumping voltage to a node according to the potential of the output terminal so that the node maintains a second potential; high voltage clock generating means for outputting the high voltage clock signal higher than the power supply voltage according to the select signal and the clock signal; a capacitor which is charged according to the high voltage clock signal so that the node maintains a third potential; and third switching means that supplies the potential of the node to the output terminal according to the potential of the node so that the output terminal maintains a fourth potential, wherein the capacitor is repeatedly charged with the high voltage according to the clock signal so that the potential of the output terminal rises to a predetermined potential.

4. The block switch as claimed in claim 3, wherein the select signal and the clock signal maintain a power supply voltage level.

5. The block switch as claimed in claim 3, further comprising high voltage clock generating means for outputting the high voltage clock signal higher than the power supply voltage according to the select signal and the clock signal.

6. The block switch as claimed in claim 3, further comprising a capacitor, which is charged according to the high voltage clock signal, so that the potential of the output terminal is increased.

7. The block switch as claimed in claim 3, wherein the high voltage clock generating means comprises:
- a NAND gate for inverting the clock signal according to the select signal; and
- a level shifter for outputting the high voltage clock signal higher than the power supply voltage according to the output signal of the NAND gate.

* * * * *